United States Patent
Cha et al.

(10) Patent No.: US 9,159,877 B2
(45) Date of Patent: Oct. 13, 2015

(54) NANO-STRUCTURED LIGHT-EMITTING DEVICE AND METHODS FOR MANUFACTURING THE SAME

(71) Applicant: SAMSUNG ELECTRONICS CO., LTD., Suwon-si, Gyeonggi-do (KR)

(72) Inventors: Nam-goo Cha, Ansan-si (KR); Dong-ho Kim, Guri-si (KR); Geon-wook Yoo, Seongnam-si (KR); Dong-hoon Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/071,411

(22) Filed: Nov. 4, 2013

(65) Prior Publication Data
US 2014/0124732 A1  May 8, 2014

(30) Foreign Application Priority Data
Nov. 5, 2012 (KR) .......... 10-2012-0124462

(51) Int. Cl.
*H01L 33/04* (2010.01)
*B82Y 20/00* (2011.01)
*H01L 33/24* (2010.01)
*H01L 33/10* (2010.01)

(52) U.S. Cl.
CPC .......... *H01L 33/24* (2013.01); *B82Y 20/00* (2013.01); *H01L 33/04* (2013.01); *H01L 33/10* (2013.01)

(58) Field of Classification Search
None
See application file for complete search history.

(56) References Cited

U.S. PATENT DOCUMENTS

| | | | | |
|---|---|---|---|---|
| 6,720,585 | B1* | 4/2004 | Wasserbauer et al. | 257/98 |
| 8,039,854 | B2* | 10/2011 | Hersee et al. | 257/91 |
| 8,350,294 | B2* | 1/2013 | Lidow et al. | 257/192 |
| 2003/0168666 | A1* | 9/2003 | Okuyama et al. | 257/80 |
| 2004/0129929 | A1* | 7/2004 | Okuyama et al. | 257/10 |
| 2010/0283064 | A1* | 11/2010 | Samuelson et al. | 257/88 |
| 2011/0309382 | A1* | 12/2011 | Lowgren | 257/88 |

FOREIGN PATENT DOCUMENTS

| | | |
|---|---|---|
| KR | 10-0649769 B1 | 11/2006 |
| KR | 10-0755610 B1 | 9/2007 |

OTHER PUBLICATIONS

English abstract to Lee et al, KR-1020070008026 A, entitled "LED and fabricating method mthereof to improve light emitting efficiency and light extraction efficiency", published as Korean Patent Abstract (Republic of Korea) on Jan. 17, 2007.*
Chen et al., "High Output Power Density and Low Leakage Current of InGaN/GaN Nanorod Light Emitting Diode with Mechanical Polishing Process" CS Mantech Conference, May 17-20, 2010, Portland, Oregon, USA, pp. 251-254.

* cited by examiner

*Primary Examiner* — Johannes P Mondt
(74) *Attorney, Agent, or Firm* — McDermott Will & Emery LLP

(57) ABSTRACT

A nano-structured light-emitting device including a first semiconductor layer; a nano structure formed on the first semiconductor layer. The nano structure includes a nanocore, and an active layer and a second semiconductor layer that are formed on a surface of the nanocore, and of which the surface is planarized. A conductive layer surrounds sides of the nano structure, a first electrode is electrically connected to the first semiconductor layer and a second electrode is electrically connected to the conductive layer.

18 Claims, 12 Drawing Sheets

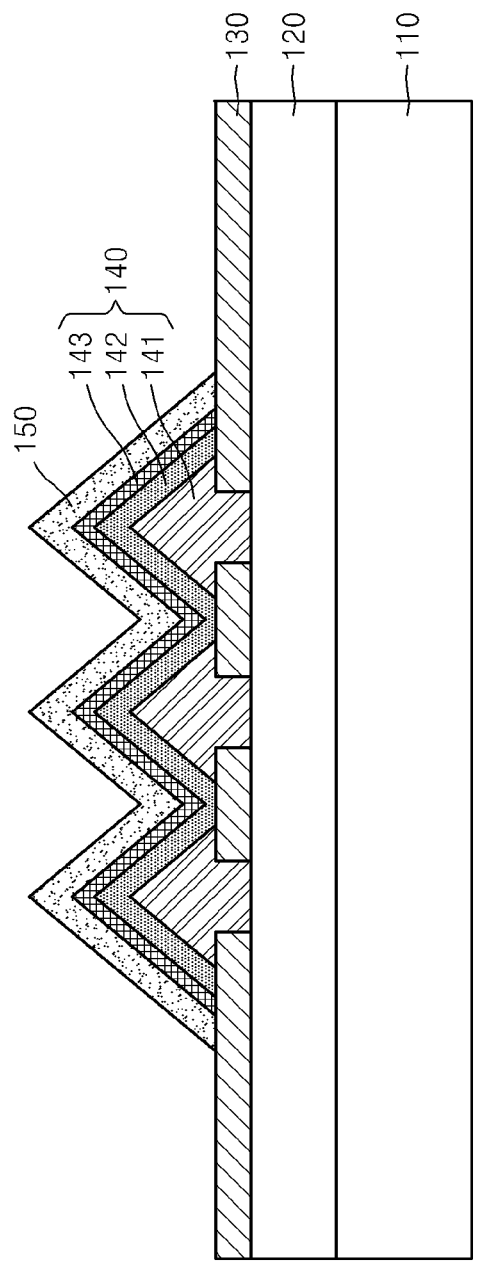

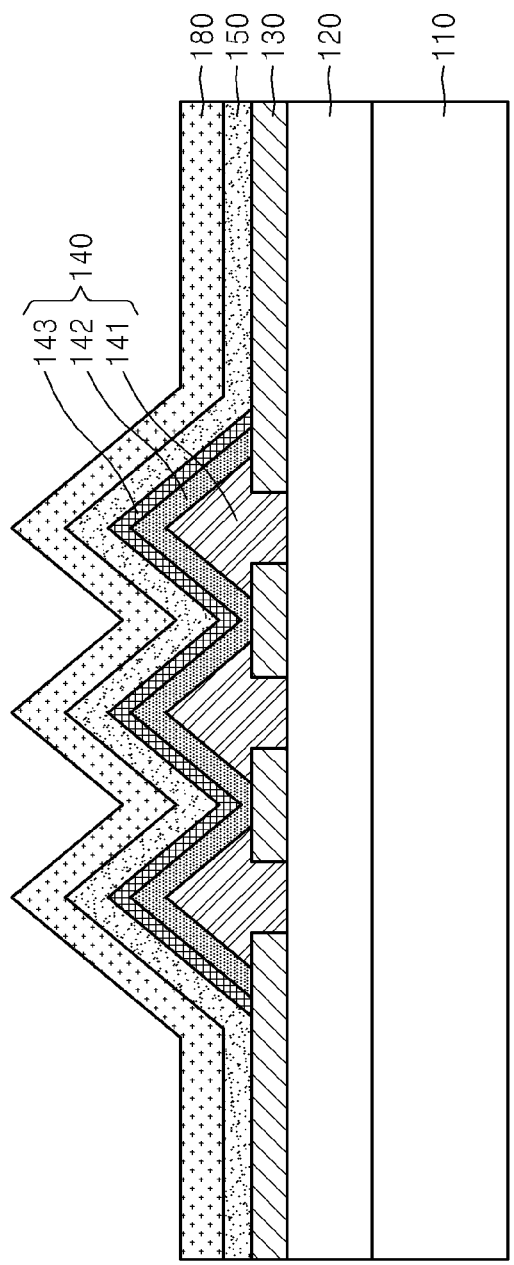

NANO-STRUCTURED LIGHT-EMITTING DEVICE AND METHODS FOR MANUFACTURING THE SAME

CROSS-REFERENCE TO RELATED APPLICATIONS

This application claims the benefit of priority to Korean Patent Application No. 10-2012-0124462, filed on Nov. 5, 2012, in the Korean Intellectual Property Office, the entire contents of which are hereby incorporated by reference.

TECHNICAL FIELD

The present disclosure relates to nano-structured light-emitting devices and methods for manufacturing the same.

BACKGROUND

The present disclosure relates to a nano-structured light-emitting device, and more particularly, to a nano-structured light-emitting device that has a structure that may improve luminescence efficiency.

A semiconductor light-emitting device such as a light emitting diode (LED) or a laser diode (LD) employs electroluminescence, that is, light emission from a semiconductor material according to application of electrical current or a voltage. As an electron and a hole combine at an active layer in the semiconductor light-emitting device, energy amounting to an energy band gap of the active layer, may be emitted in the form of light. Accordingly, a wavelength of light, generated from the light-emitting device, may vary with an amount of the energy band gap of the active layer.

Semiconductor light-emitting devices may be classified into a two-dimensional (2D) light-emitting device, that is, a thin-film light-emitting device in which an active layer is formed in two dimensions, and a three-dimensional (3D) light-emitting device in which an active layer is formed in three dimensions. In a case of the 3D light-emitting device, for example, a light-emitting device with structure including a plurality of nanorods, an active layer is formed in three dimensions. Thus, a light-emitting area of the 3D light-emitting device may be larger in comparison to the 2D light-emitting device. Accordingly, luminescent efficiency may be improved, and colors may be displayed relatively freely throughout the light-emitting device.

Compared to the increase in the light-emitting area, the 3D light-emitting device may provide a relatively low increase in luminescent efficiency. In a case of an LED with a structure, from among 3D structures, of a nano pyramid when electrical current is injected to the LED, the electrical current may be concentrated on the top of the structure. Accordingly, light may be emitted only from the top.

Accordingly, a need exists for an LED with an improved luminescent efficiency.

SUMMARY

An aspect of the present disclosure relates to a nano-structured light-emitting device including a first semiconductor layer; a nano structure disposed on the first semiconductor layer and including a nanocore, and an active layer and a second semiconductor layer disposed on a surface of the nanocore, the nano structure having a planar upper surface; a conductive layer surrounding sides of the nano structure; a first electrode electrically connected to the first semiconductor layer; and a second electrode electrically connected to the conductive layer.

The nano structure may have a shape of a rod.

At least one from among the nanocore, the active layer, and the second semiconductor layer may include a hexagonal prismoid having a flat upper surface.

The active layer may have a flat upper surface, and an extended surface of the flat upper surface of the active layer and an extended surface of an upper surface of the second semiconductor layer may form a same surface.

The nano structure may include a shape of a hexagonal prismoid, and further include a shape of a rod at a lower part of the shape of the hexagonal prismoid.

The nano-structured light-emitting device may further include an insulating layer disposed on a plurality of nano structures and the conductive layer the insulating layer allowing light transmission.

The insulating layer may include a distributed bragg reflector (DBR).

The nano-structured light-emitting device may further include a reflective layer disposed on the insulating layer.

The nano-structured light-emitting device may further include a passivation layer disposed on a partial area on the conductive layer.

The nano-structured light-emitting device may further include a mask layer disposed on an upper surface of the first semiconductor layer, the mask layer including a through-hole, wherein the nanocore protrudes from the through-hole.

Another aspect of the present disclosure relates to a nano-structured light-emitting device including a first semiconductor layer; at least one nano structure disposed on the first semiconductor layer and including sides that are inclined toward the first semiconductor layer, the at least one nano structure having a flat upper surface substantially in parallel with the first semiconductor layer; and a conductive layer covering the sides of the at least one nano structure.

The at least one nano structure may include a GaN-based nanocore having a surface that is one of a non-polar surface and a quasi-polar surface; an active layer disposed on the surface of the GaN-based nanocore; and a GaN-based second semiconductor layer disposed on a surface of the active layer and having a flat upper surface.

The GaN-based nanocore may include $Al_xIn_yGa_{1-x-y}N$ containing a p-type impurity, where $0 \le x \le 1$, $0 \le y \le 1$, and $x+y<1$.

The active layer may include a quantum-well structure having stacked layers, in which $In_aGa_{1-a}N/Al_xIn_yGa_{1-x-y}N$, where $0 \le a \le 1$, $0 \le x \le 1$, $0 \le y \le 1$, and $x+y<1$.

The second semiconductor layer may include $Al_xIn_yGa_{1-x-y}N$ containing an n-type impurity, where $0 \le x \le 1$, $0 \le y \le 1$, and $x+y<1$.

Another aspect of the present disclosure relates to a method of manufacturing a nano-structured light-emitting device. The method includes sequentially disposing a first semiconductor layer and a mask layer on a substrate, disposing a through-hole in the mask layer disposing a nanocore in the through-hole and sequentially disposing an active layer and a second semiconductor layer on the nanocore to form a nano structure having a defined geometric shape, disposing a conductive layer on the nano structure and the mask layer, and disposing a passivation layer on the conductive layer.

The method may further include planarizing an upper surface of the passivation layer, the conductive layer and the nano structure.

The planarizing may only planarize the second semiconductor layer of the nano structure.

The planarizing may planarize the second semiconductor layer and the active layer of the nano structure.

BRIEF DESCRIPTION OF THE DRAWINGS

The foregoing and other features of the present disclosure will be apparent from more particular description of embodiments of the inventive concept, as illustrated in the accompanying drawings in which like reference characters may refer to the same or similar elements throughout the different views. The drawings are not necessarily to scale, emphasis instead being placed upon illustrating the principles of the embodiments of the inventive concept. In the drawings, the thickness of layers and regions may be exaggerated for clarity.

Exemplary embodiments of the present disclosure will be more clearly understood from the following detailed description taken in conjunction with the accompanying drawings in which:

FIGS. 6A through 6G are cross-sectional side views of a structure of a nano-structured light-emitting device for explaining a method of manufacturing the same, according to embodiments of the present disclosure;

DETAILED DESCRIPTION OF THE EMBODIMENTS

Hereinafter, the present disclosure will be described more fully with reference to the accompanying drawings in which exemplary embodiments of the invention are shown.

Embodiments to be described herein are only examples, and various modifications thereof may be made. For example, when a layer is referred to as being "on," or "on the top of" a substrate or another layer, it can be directly on the substrate or the layer, or an intervening layer may also be present therebetween.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are not intended to preclude the possibility that one or more other features, numbers, steps, actions, components, parts, or combinations thereof may exist or may be added. While such terms as "first," "second," etc., may be used to describe various components, such components must not be limited to the above terms. The above terms are used only to distinguish one component from another.

If an embodiment may be implemented otherwise, a particular process can be performed in a different order from the order described herein. For example, two processes illustrated in succession may in fact be executed substantially concurrently, or the processes may sometimes be executed in the reverse order.

Figure 1:
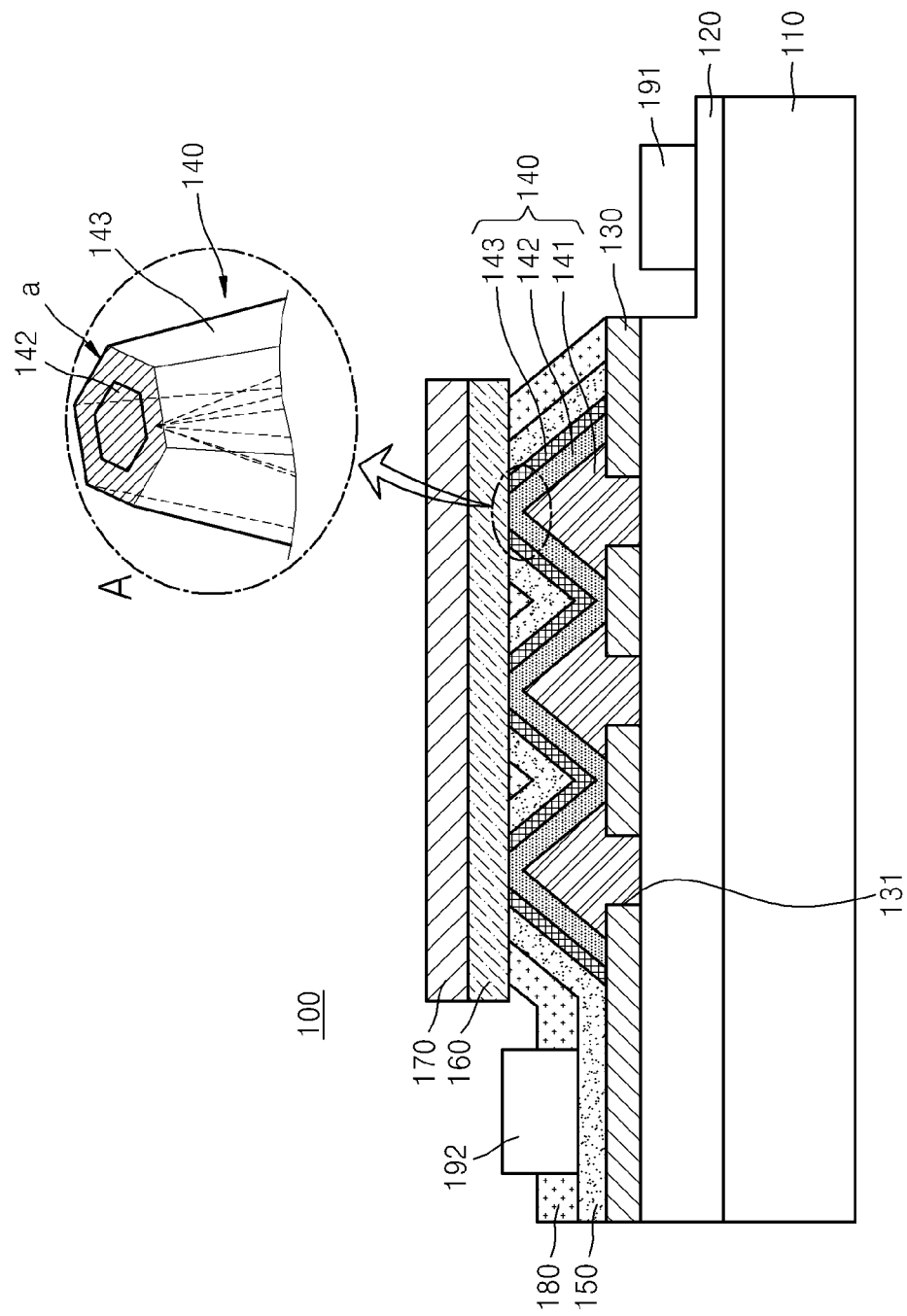
FIG. 1 is a cross-sectional perspective view of a structure of a nano-structured light-emitting device, according to an embodiment of the present disclosure.

Referring to FIG. 1, a nano-structured light-emitting device 100 includes a first semiconductor layer 120, a mask layer 130, nano structures 140, a conductive layer 150, a first electrode 191, and a second electrode 192.

The nano-structured light-emitting device 100 may further include an insulating layer 160. Additionally, the nano-structured light-emitting device 100 may further include a reflective layer 170 that is disposed on the insulating layer 160. Additionally, the nano-structured light-emitting device 100 may further include a passivation layer 180 disposed on a partial area of the conductive layer 150. Additionally, the nano-structured light-emitting device 100 may further include a substrate 110 below the first conductive layer 120.

The substrate 110 may function to grow the first conductor layer 120. The substrate 110 may be one of various substrates used for general semiconductor device processing. For example, the substrate 110 may be a sapphire ($Al_2O_3$) substrate, a silicon (Si) substrate, a silicon carbide (SiC) substrate, an aluminum nitride (AlN) substrate, a silicon-aluminum (Si—Al) substrate, or a nitride substrate. Alternatively, a substrate formed of a material suitable for growing the first conductor layer, for example, ZnO, GaAs, $MgAl_2O_4$, MgO, $LiAlO_2$, $LiGaO_2$, or GaN, may be used as the substrate 110. However, such substrates are only examples, and other substrates may also be used as the substrate 110. After manufacturing the nano-structured light-emitting device 100, the substrate 110 may be selectively removed.

The first semiconductor layer 120 may include a nitride that contains gallium. The first semiconductor layer 120 may include $Al_xIn_yGa_{1-x-y}N$, where $0 \leq x \leq 1$, $0 \leq y \leq 1$ and $x+y<1$. For example, the first semiconductor layer 120 may be formed of a material including one from among GaN, InGaN, and AlInGaN. Additionally, the first semiconductor layer 120 may have a single-layered or multi-layered structure, and may include a nucleation growth layer and/or a buffer layer for improving growth. The first semiconductor layer 120 may be selectively undoped or doped. For example, the first semiconductor layer 120 may be an n-type conductor layer. Alternatively, the first semiconductor layer 120 may be a p-type conductor layer.

The mask layer 130 is included on the first semiconductor layer 120. The mask layer 130 includes at least one through-hole 131 that exposes a part of the first semiconductor layer 120. The mask layer 130 may be patterned so that the nano structure 140 may grow through the through-hole 131. The mask layer 130 may be etched and formed to have a pattern of a desired through-hole 131 by using a lithography process. For example, the through-hole 131 may have a section shaped of a circle, an oval, or a polygon. The mask layer 130 may be formed to include one or more insulating materials, for example, from among silicon dioxide ($SiO_2$), $TiO_2$, $Si_3N_4$, $Al_2O_3$, TiN, MN, $ZrO_2$, TiAlN, or TiSiN as an insulating material.

The nano structure 140 may protrude from the through-hole 131 on the mask layer 130, thus having a shape of a hexagonal prismoid. The nano structure 140 may include a nanocore 141 doped as a first type and having a shape of a hexagonal pyramid, an active layer 142 disposed on a surface of the nanocore 141, and a second semiconductor layer 143 disposed on a surface of the active layer 142. The active layer 142 and/or the second semiconductor layer 143 may have a flat upper surface be doped as a second type. That is, the nano structure 140 may have a structure of a core-shell in which the nanocore 141 constitutes a core, and the active layer 142 and the second conductor layer 143 that cover the nanocore 141 constitute a shell.

The nanocore 141 may be formed of a nitride conductor layer, for example, $Al_xIn_yGa_{1-x-y}N$, where $0 \le x \le 1$, $0 \le y \le 1$ and $x+y<1$. The nanocore 141 may be doped as the first type. The first type may be, for example, an n-type. Si, Ge, Se, Te, or the like may be used as an n-type impurity. The nanocore 141 grows from the first conductor layer 120 through the through-hole 131 formed on the mask layer 130. The nanocore 141 has a shape of a hexagonal pyramid, and has a section shaped of a hexagon.

The active layer 142 may be a layer that emits light according to recombination of an electron and a hole. The active layer 142 may have a structure formed by alternately stacking a quantum-well layer and a barrier layer for one or more times. The quantum well layer may have a structure of a single-quantum well or a multi-quantum well that is formed, for example, by adjusting a band-gap by variably changing values of x, y, and z in $Al_xGa_yIn_zN$. As another example, a structure of a single-quantum well or a multi-quantum well may be formed by stacking the quantum-well layer and the barrier layer in pairs in the form of InGaN/GaN, InGaN/InGaN, InGaN/AlGaN or InGaN/InAlGaN. A light-emitting wavelength band may be adjusted by controlling band-gap energy according to a mole fraction of indium (In) in the InGaN layer. The active layer 142 may grow from the nanocore 141 in a radial shape and be formed to cover a surface of the nanocore 141.

The second conductor layer 143 is provided to cover a surface of the active layer 142. The second conductor layer 143 may be formed of a Group III-V semiconductor compound, for example, a nitride conductor. For example, the second conductor layer 143 may be formed of $Al_xIn_yGa_{1-x-y}N$, where $0 \le x \le 1$, $0 \le y \le 1$ and $x+y<1$. The second conductor layer 143 may be doped as the second type. The second type may be, for example, a p-type. B, Al, magnesium (Mg), Ca, zinc (Zn), Cd, Hg, Ga, or the like may be used as a p-type impurity. Alternatively, the nanocore 141 may be doped as the second type and the second semiconductor layer 143 may be doped as the first type.

An electron may be supplied from the nanocore 141 to the active layer 142, and a hole may be supplied from the second conductor layer 143 to the active layer 142. As the electron and the hole combine at the active layer 142, light may be emitted. The light is emitted through a surface of the nano structures 140. The nano structure 140 has a three-dimensional (3D) shape, and thus, has a larger light-emission area compared to a thin-film light-emitting device that is formed in two dimensions. Therefore, the nano structure 140 may have high luminous efficiency.

A region A, shown in FIG. 1, illustrates a schematic perspective view of the nano structure 140, including the nanocore 141, the active layer 142, and the second semiconductor layer 143 disposed on the mask layer 130.

Referring to the region A of FIG. 1, an area of the nano structure 140 on the mask layer 130 has a shape of a hexagonal prismoid. In commonly used dictionaries, a hexagonal prismoid is defined as a part, between a base plane and a plane parallel to the base plane, obtained by cutting a hexagonal pyramid along the plane parallel to the base plane. However, the hexagonal prismoid described herein, may further include a hexagonal prismoid in which an upper plane is not parallel to a base plane. That is, a hexagonal prismoid includes a shape that has six sides that are vertically inclined from a hexagonal base plane, and an upper flat surface that is parallel to or inclined to the hexagonal base plane at one end.

That is, an upper surface a of the nano structure 140 may include a flat surface. The upper surface a of the nano structure 140 may be parallel to the mask layer. However, instead of being parallel to the mask layer at one end, the upper surface a of the nano structure 140 may be inclined to the mask layer at one end.

The nano structure 140 may have a shape of a hexagonal prismoid. However, shapes of the nanocore 141, the active layer 142, and the second semiconductor layer 143, which all constitute the nano structure 140, may be different from one other. For example, the nanocore 141 may have a shape of a hexagonal pyramid, and the active layer 142 and the second semiconductor layer 143 that cover the nanocore 141 may have a shape of a hexagonal prismoid. Additionally, a size of upper surfaces of the active layer 142 and the second semiconductor layer 143 may be variably adjusted. According to another embodiment of the present disclosure, the nanocore 141 and the active layer 142 may have a shape of a hexagonal pyramid, and the second semiconductor layer 143 may have a shape of a hexagonal prismoid. According to another embodiment of the present disclosure, the nanocore 141, the active layer 142, and the second semiconductor layer 143 may all have a shape of a hexagonal prismoid.

The active layer 142 and/or the second semiconductor layer 143 may also be included on the mask layer 130 on which the nanocore 141 is not formed. That is, the active layer 142 and/or the second semiconductor layer 143 may be formed to entirely cover an upper surface of the mask layer 130. Additionally, various modified structures may be used.

When a nano structure has a shape of a hexagonal pyramid having an apex on an upper part, electrical current may be concentrated on the apex. Accordingly, light may be emitted mainly from the apex on the upper part of the nano structure, and partially emitted from sides that take up most of an area of the nano structure.

The nano structure 140, according to an embodiment of the present disclosure, includes a flat upper surface, thus preventing concentration of electrical current on the upper surface. Accordingly, the electrical current may be easily applied to the sides of the nano structure 140, and thus, luminous efficiency may improve at the sides of the nano structure 140.

When the nano structure 140 is formed of a GaN-based semiconductor, a nanocore 141 of the nano structure 140 may be formed so that its surface is inclined to the first semiconductor layer 120. The inclined surface of the nanocore 141 may be a non-polar surface or a quasi-polar surface.

Generally, a two-dimensional (2D) GaN-based semiconductor layer is formed along a c-axis, and thus, has a polar surface. If the GaN-based semiconductor is formed on a polar surface, an electron and a hole are separated from each other on the GaN-based semiconductor layer, and thus, piezo polarization increases. Accordingly, a band may be bent, and device characteristics may deteriorate. Otherwise, if the GaN-based semiconductor grows on the non-polar surface or the quasi-polar surface, piezo polarization may decrease, and device characteristics may improve.

The nano-structured light-emitting device 100 includes the nano structure 140 that includes the nanocore 141, which has a non-polar surface, and the active layer 142 and the second semiconductor layer 143, which grow on the non-polar surface. Thus, luminous efficiency may be increased.

The conductive layer 150 is disposed on the mask layer 130, and covers sides of a plurality of the nano structures 140. Additionally, the conductive layer 150 includes a portion that is connected to the second electrode 192. The conductive layer 150 is a path through which a current is supplied to the nano structures 140. The conductive layer 150 may be formed of various conductive materials. In some embodiments, the conductive layer 150 may be formed to include metal, for example, silver (Ag), aluminum (Al), titanium (Ti), nickel (Ni), gold (Au), Ti/Au, Ni/Au, or Ni/Ag. In another embodiment, the conductive layer 150 may be formed of a transparent conductive oxide (TCO) for transmitting light emitted from the nano structure 140. For example, the conductive layer 150 may be formed of indium tin oxide (ITO), aluminium zinc oxide (AZO), indium zinc oxide (IZO), zinc oxide (ZnO), ZnO:Ga (GZO), indium oxide ($In_2O_3$), tin oxide ($SnO_2$), cadmium oxide (CdO), cadmium tin oxide (Cd-$SnO_4$), or gallium oxide ($Ga_2O_3$ The first electrode 191 is electrically connected to the first semiconductor layer 120. The second electrode 192 is electrically connected to the conductive layer 150, and thus, electrically connected to the second semiconductor layer 143. That is, the first electrode 191 and the second electrode 192 are respectively electrically connected to the first semiconductor layer 120 and the second semiconductor layer 143, so that a voltage for injecting an electron and a hole is applied to the active layer 142. The first electrode 191 and the second electrode 192 may be formed of a transparent conductive material such as ITO, IZO, ZnO, or $SnO_2$. However, the material is not limited thereto and the first electrode 191 and the second electrode 192 may be formed of various non-transparent conductive materials.

The nano-structured light-emitting device 100 may further include the insulating layer 160 on the nano structures 140 and the conductive layer 150. The insulating layer 160 may be provided to reduce electrical current that may leak through an upper part of the conductive layer 150 or the nano structure 140. In some embodiments, the insulating layer 160 is formed of an insulating material that allows light transmission. For example, the insulating layer 160 may be formed of an oxide film that has high light transmissibility. For example, the insulating layer 160 may include $SiO_2$ or $Al_2O_3$. In some embodiments, the insulating layer 160 may be formed of an insulating material that allows light reflection. For example, the insulating layer 160 may include a distributed bragg reflector (DBR) that is formed of an insulating material. The DBR may have a structure having a plurality of insulating materials of different refractive indices and that are stacked. If the insulating layer 160 allows light reflection, light that is directed upward may be reflected downward and emitted toward the first semiconductor layer 120. In this case, the nano-structured light-emitting device 100 may be a light-emitting device in the form of a flip chip.

The nano-structured light-emitting device 100 may further include the reflective layer 170 disposed on the insulating layer 160. The reflective layer 170 functions to reflect light emitted from the nano structure 140 in a downward direction. As light generated from the active layer 142 of the nano structure 140 is emitted in the form of a spontaneous-emission type, the light does not have a specific emission direction, and thus may be emitted in every direction. Light emitted upwards, among the light generated from the active layer 142, may be reflected in a downward direction, so that a light-emitting direction may be formed to direct toward the first semiconductor layer 120. In such a case, the nano-structured light-emitting device 100 may be a light-emitting device in the form of a flip chip. The reflective layer 170 may be formed of a high light-reflectance material, for example, at least one or more metal elements from among Ag, silver oxide ($Ag_2O$), Al, Zn, Ti, rohdium (Rh), Mg, palladium (Pd), ruthenium (Ru), and the like. In some embodiments, the reflective layer 170 may include a DBR. The DBR may have a structure having a plurality of insulating materials of different refractive indices and that are stacked. For example, the DBR may be a conductive DBR in which ITO layers that have different refractive indices are stacked. As another example, the DBR may be an insulating DBR in which oxide layers that have different refractive indices are alternately stacked.

The nano-structured light-emitting device 100 may further include a passivation layer 180, on the portion of the conductive layer 150 that is not covered with the second electrode 192 and the insulating layer 160. The passivation layer 180 may function to protect the conductive layer 150 from an external environment. The passivation layer 180 may be formed of an insulating material such as silicon nitride (SiN). The passivation layer 180 may also be formed of $SiO_2$, which has high light transmissibility, or a transparent polymer.

In the remaining figures, reference numerals in the drawings that are the same as in FIG. 1 denote the same elements as in FIG. 1, and thus for the sake of brevity, their descriptions will not be provided here.

Figure 2:
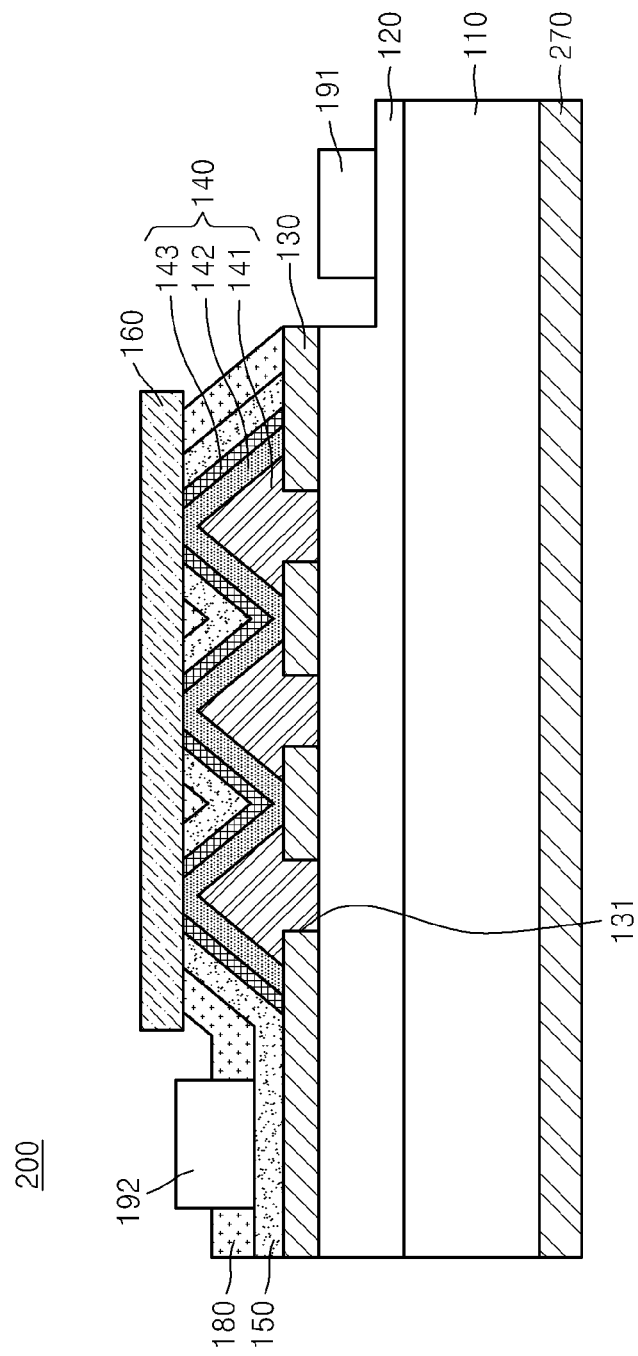
FIG. 2 is a cross-sectional side view of a structure of a nano-structured light-emitting device, according to another embodiment of the present disclosure.

Referring to FIG. 2, in a nano-structured light-emitting device 200, compared to the nano-structured light-emitting device 100 of FIG. 1, a reflective layer 270 is disposed below the substrate 110. In the nano-structured light-emitting device 200, the reflective layer 270 functions to reflect light emitted from the nano structure 140 in an upward direction. That is, the reflective layer 270 functions to reflect light that is emitted downwards, from among light emitted from active layer 142 of the nano structure 140, in an upward direction. In this case, the nano-structured light-emitting device 200 may be a top-emission type light-emitting device. In some embodiments, the reflective layer 270 may be formed of a high light-reflectance material, for example, at least one or more metal elements from among Ag, $Ag_2O$, Al, Zn, Ti, rohdium Rh, Mg, Pd, Ru, and the like. In some embodiments, the reflective layer 270 may include a DBR. The DBR may have a structure having a plurality of insulating materials of different refractive indices and that are stacked. For example, the DBR may be a conductive DBR in which ITO layers that have different refractive indices are stacked. As another example, the DBR may be an insulating DBR in which oxide layers that have different refractive indices are alternately stacked.

Figure 3:
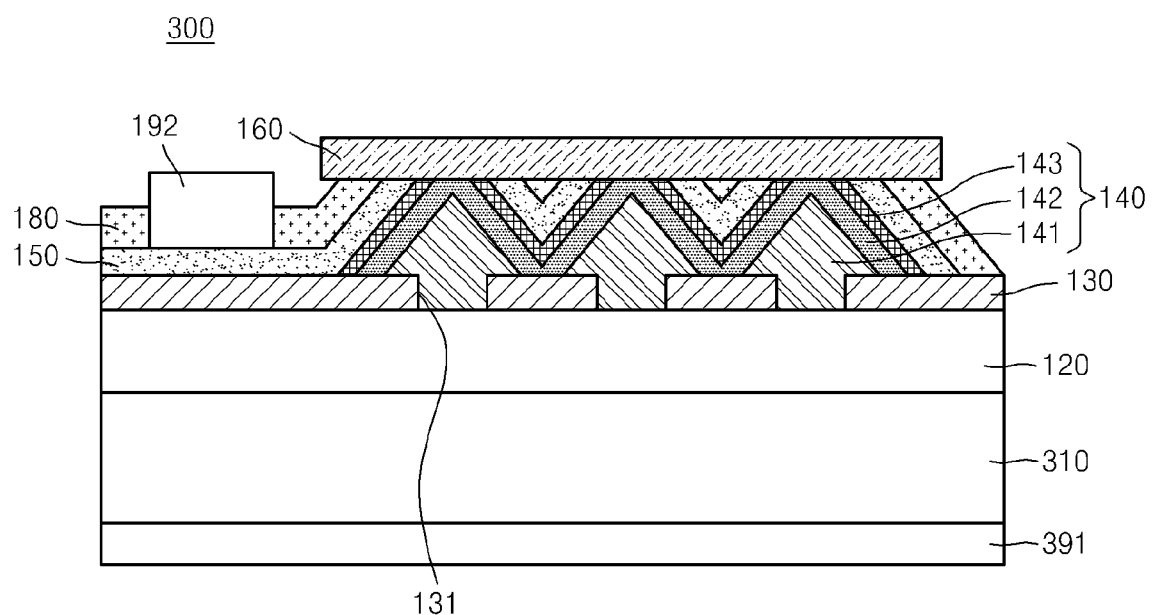
FIG. 3 is a cross-sectional side view of a structure of a nano-structured light-emitting device, according to another embodiment of the present disclosure.

Referring to FIG. 3, in a nano-structured light-emitting device 300, compared to the nano-structured light-emitting device 100 of FIG. 1, a first electrode 391, which is electrically connected to the first semiconductor layer 120, is disposed below a substrate 310. The substrate 310 may be formed of a conductive material that is transparent to light and through which a current may pass. For example, the substrate 310 may be a Si substrate, a Si—Al substrate, or the like. The first electrode 391 may function to apply a voltage to the first semiconductor layer 120 and may also function to reflect light. The first electrode 391 may be formed of the same material as the first electrode 191 of FIG. 1.

Figure 4:
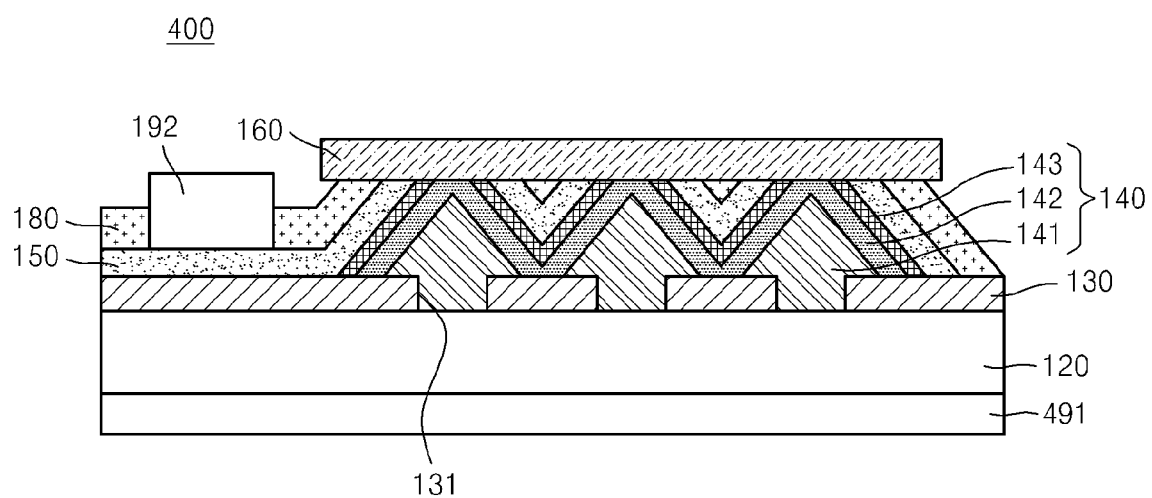
FIG. 4 is a cross-sectional side view of a structure of a nano-structured light-emitting device, according to another embodiment of the present disclosure.

Referring to FIG. 4, in a nano-structured light-emitting device 400, compared to the nano-structured light-emitting device 100 of FIG. 1, the substrate 310 shown in FIG. 3 is removed, and a first electrode 491 is included directly on the first semiconductor layer 120. If the substrate 310 is formed of an insulating material such as a sapphire substrate, the substrate 310 may be removed and the first electrode 491 may be included. The first electrode 491 may be formed of the same material as the first electrode 191 of FIG. 1.

Figure 5A:
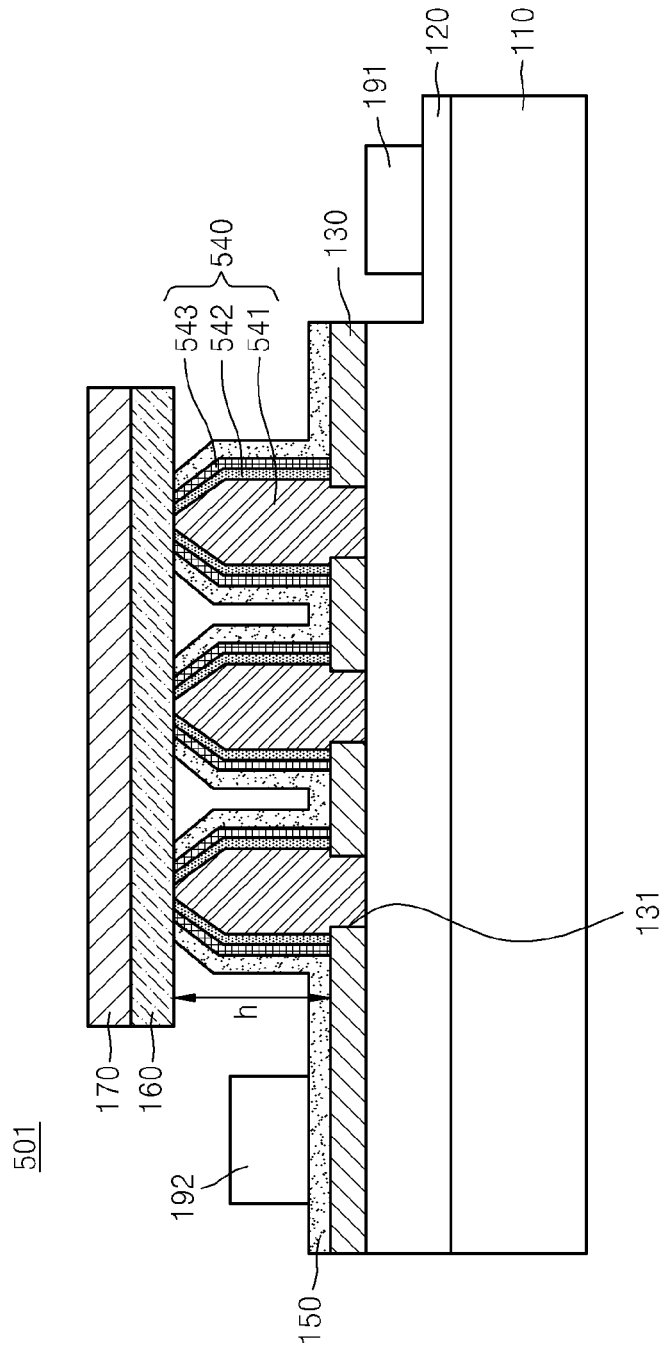
FIG. 5A is a cross-sectional side view of a structure of a nano-structured light-emitting device, according to another embodiment of the present disclosure.

Referring to FIG. 5A, in a nano-structured light-emitting device 501, compared to the nano-structured light-emitting device 100 of FIG. 1, the nano-structure 540 includes a shape of a rod.

The nano structure 540 has a shape of a rod that protrudes vertically from the through-hole 131 on the mask layer 130. An upper part of the rod shape has a shape of a prismoid. The shape of the pyramid may be of a truncated cone or a hexagonal prismoid. The nano structure 540 includes a nanocore 541 doped as a first type, an active layer 542 disposed on a surface of the nanocore 541, and a second semiconductor layer 543 disposed on a surface of the active layer 542. The active layer 142 and/or the second semiconductor layer 143 may have a flat upper surface and be doped as a second type. That is, the nano structure 540 may have a structure of a core shell in which the nanocore 541 constitutes a core, and the active layer 542 and the second conductor layer 543 that cover the nanocore 541 constitute a shell.

In order to form the nano structure 540, the nanocore is grown from the first conductor layer 120 through the through hole 131, and the active layer 542 and the second semiconductor layer 543 are sequentially deposited on a surface of the nanocore 541. In some embodiments, methods such as metal organic chemical vapor deposition (MOCVD), hydride vapor phase epitaxy (HYPE), molecular beam epitaxy (MBE), metal organic vapor phase epitaxy (MOVPE), halide chemical vapour deposition (HCVD), atomic layer deposition (ALD), or plasma enhanced CVD (PECVD) may be used for the nanocore 541, the active layer 542, and the second semiconductor layer 543. In some embodiments, when the nanocore 541 is deposited by using MOCVD, an amount of hydrogen in a H2/N2 carrier gas mixture may be adjusted in order to adjust a shape of the nanocore 541. By adjusting a condition of the deposition, the nano structure 540 may be formed to have a shape of a nanorod that includes a shape of a cone or a pyramid with an apex on an upper part and a shape of a rod at a lower part. A material of the nano structure 540 may be the same as the material of the nano structure 140 in the nano-structured light-emitting device 100 shown in FIG. 1.

Then, an upper surface planarization process for planarizing an upper surface of the nano structure 540 is executed. In some embodiments, the upper surface planarization process may be executed by using chemical mechanical polishing (CMP). Before performing CMP, the conductive layer 150 and/or a passivation layer (not illustrated) may be formed on the nano structure 540. Through CMP, a height h and a shape of the nano structure 540 may be adjusted.

Figure 5B:
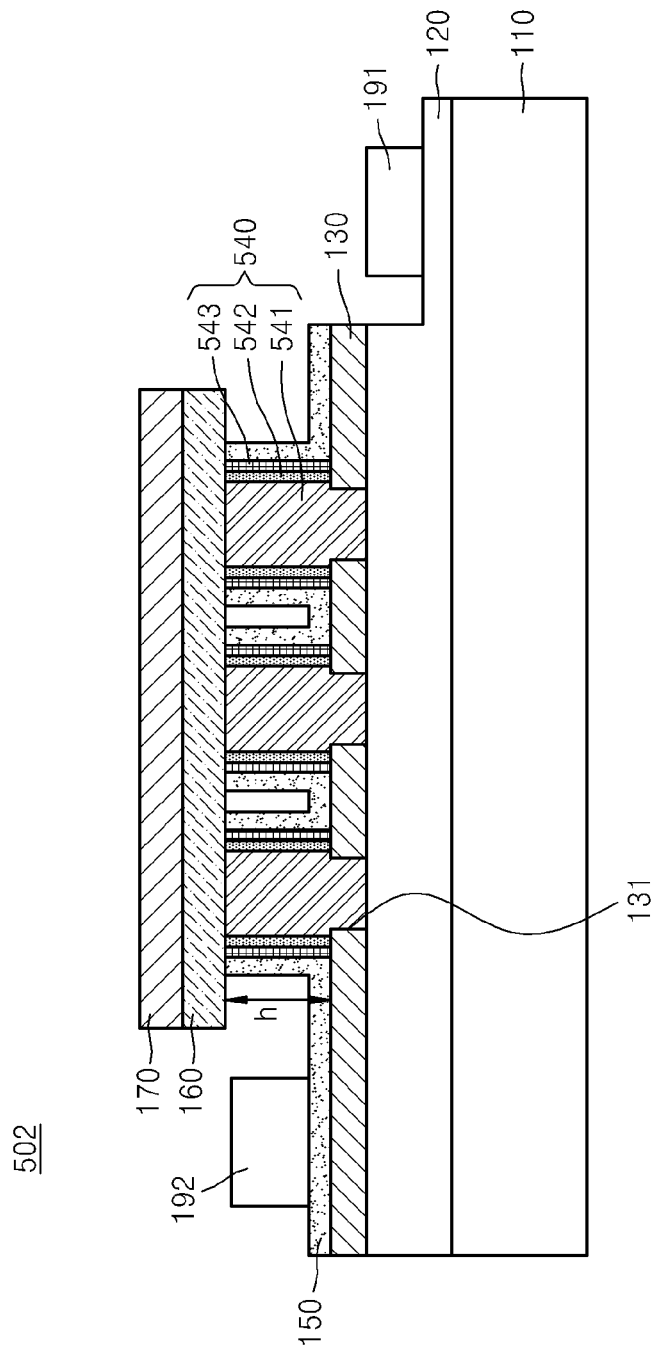
FIG. 5B is a cross-sectional side view of a structure of a nano-structured light-emitting device, according to another embodiment of the present disclosure.

Referring to FIG. 5B, in a nano-structured light-emitting device 502, compared to the nano-structured light-emitting device 501 shown in FIG. 5A, the nano structure 540 only has a shape of a rod and does not include a shape of a prismoid on an upper part.

By performing an upper surface planarization process for planarizing an upper surface of the nano structure 540, a height h of the nano structure 540 may be adjusted, and a shape of the nano structure 540 may also be adjusted. Through the upper surface planarization process, an extended surface of an upper surface of the active layer 542 and an extended surface of an upper surface of the second semiconductor layer 543 may form the same surface. In some embodiments, extended surfaces of upper surfaces of the nanocore 541, the active layer 542, and the second semiconductor layer 543 may form the same surface.

A shape of the nano structure 540 of the nano-structured light-emitting device 502 shown in FIG. 5B may be formed from a shape of the nano structure 540 of the nano-structured light-emitting device 501 shown in FIG. 5B, but is not limited thereto. For example, the nano structure 540, which is grown before upper surface planarization of the nano structure 540, may be formed to only have a rod shape.

After the upper surface of the nano structure 540 is formed to be flat, the insulating layer 160 and/or the reflective layer 170 may be sequentially formed. In some embodiments, the insulating layer 160 may perform light reflection. In such a case, the reflective layer 170 may be omitted.

When a nano structure has an apex on an upper part, electrical current may be concentrated on the apex. Accordingly, light may be emitted mainly from the apex on the upper part of the nano structure, and thus, may be partially emitted from sides that take up most of an area of the nano structure.

The nano structure 540, according to an embodiment of the present disclosure, includes a flat upper surface, thus preventing concentration of electrical current on the upper surface. Accordingly, the electrical current may be easily applied to the sides of the nano structure 540, and thus, luminous efficiency may improve at the sides of the nano structure 540.

FIGS. 6A through 6G are cross-sectional views of the structure of the nano-structured light-emitting device 100 for explaining a method of manufacturing the same, according to embodiments of the present disclosure. A process of manufacturing the nano-structured light-emitting device 100 shown in FIG. 1 is described herein.

Figure 6A:
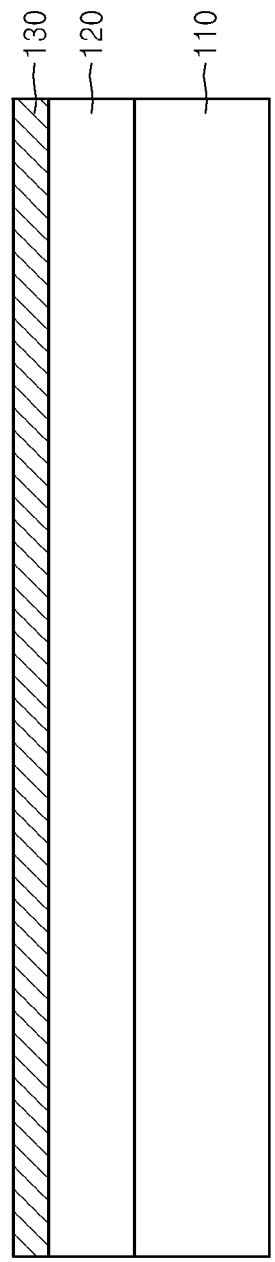

Referring to FIG. 6A, the first semiconductor layer 120 and the mask layer 130 are sequentially deposited on the substrate 110. The first semiconductor layer 120 may be formed of a plurality of layers and may be selectively doped. The first semiconductor layer 120 and the mask layer 130 may be formed by using various generally known thin-film growing methods. For example, a method such as epitaxial deposition, MOCVD, HYPE, MBE, MOVPE, sputtering, HCVD, ALD, PECVD or the like may be used.

Figure 6B:
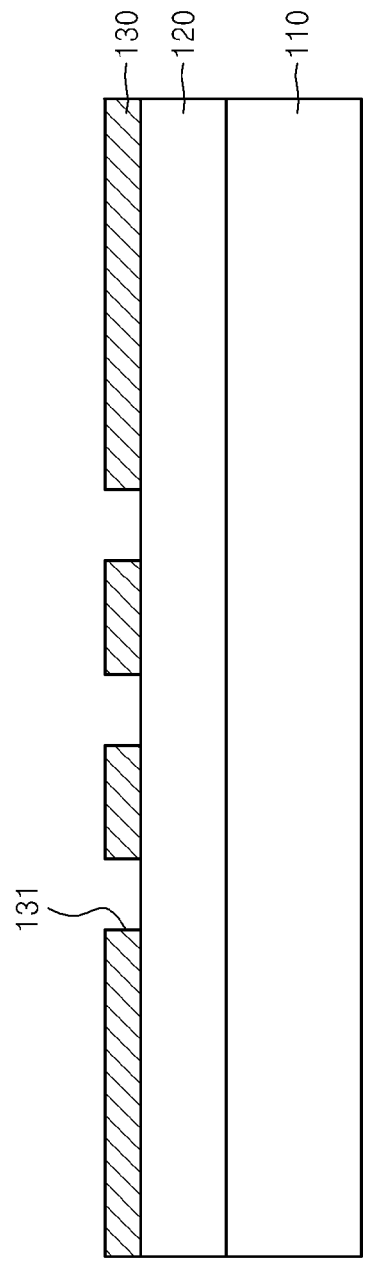

Referring to FIG. 6B, at least one through-hole 131 may be formed by partially etching the mask layer 130. The first semiconductor layer 120 may be exposed through the through-hole 131. In some embodiments, in order to form the through-holes 131, a plurality of photoresist (PR) patterns and/or hard-mask patterns (not illustrated) are formed on the mask layer 130 by using a photolithography process. Then, a process of etching the mask layer 130 by using the plurality of hard-mask patterns as an etching mask may be employed. In some embodiments, nanoimprint lithography may be used, so as to form the through-holes 131.

Referring to FIG. 6C, the nanocore 141 is grown from the first conductor layer 120 through the through hole 131, and the active layer 142 and the second semiconductor layer 143 are sequentially deposited on a surface of the nanocore 141. The nano structure 140, which includes the nanocore 141, the active layer 142, and the second semiconductor layer 143, may be formed according to a pattern of the mask layer 130. In some embodiments, a method such as MOCVD, HYPE, MBE, MOVPE, HCVD, ALD, PECVD or the like may be used for the nanocore 141, the active layer 142, and the second semiconductor layer 143. In some embodiments, when the nanocore 141 is deposited by using the MOCVD, an amount of hydrogen in a H2/N2 carrier gas mixture may be adjusted in order to adjust a shape of the nanocore 141.

FIG. 6C illustrates the nano structure 140, which has a shape of a nano pyramid. However, a shape of the nano structure 140 may vary with a deposition condition. For example, like the nano structures 540 shown in FIGS. 5A and 5B, the nano structure 140 may have a shape of a nanorod that includes a shape of a cone or a pyramid with an apex on its upper part and a shape of a rod at its lower part.

Referring to FIGS. 6C and 6D, the conductive layer 150 is deposited to cover the mask layer 130 and a plurality of the nano structures 140, and the passivation layer 180 may be deposited on the conductive layer 150. The conductive layer 150 and the passivation layer 180 may be deposited by using various deposition methods. The passivation layer 180 functions to protect the conductive layer 150, on which the second electrode 192 is to be formed when an upper surface planarization process to be described later is executed, from various chemical compositions and particles.

Figure 6E:
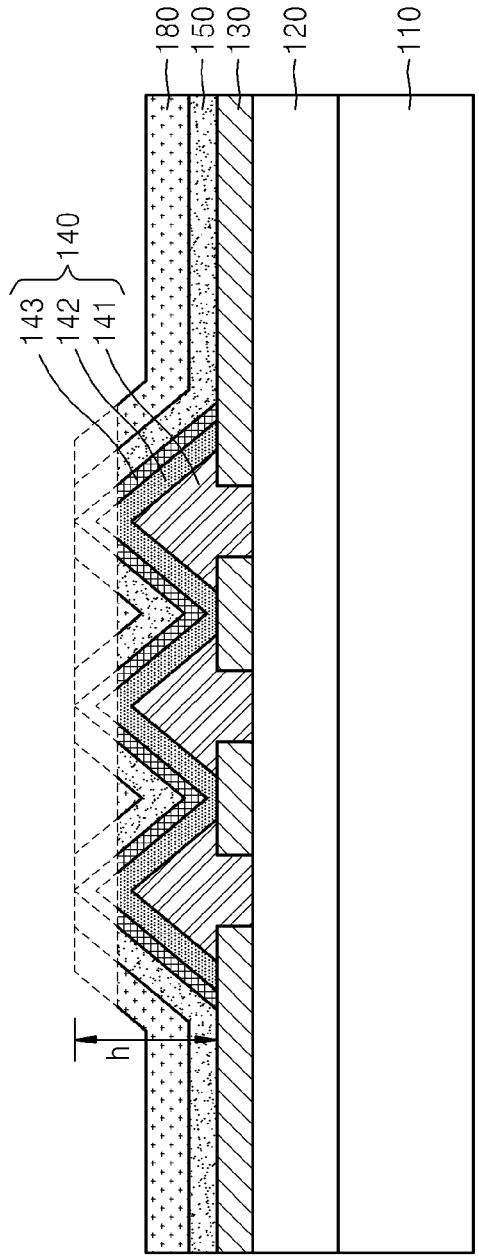

Referring to FIG. 6E, an upper surface planarization process for planarizing an upper surface of the passivation layer 180, the conductive layer 150, and the plurality of nano structures 140 is executed. That is, upper surfaces of the passivation layer 180, the conductive layer 150, and the plurality of nano structures 140 are formed to be flat, and thus, to be nearly or completely parallel to the mask layer 130. The upper surface planarization process may be executed by using chemical mechanical polishing (CMP). In such a case, various chemical compositions such as an abrasive material, a dispersing agent, or an acidity control agent may be used. In some embodiments, at least one from among a nanodiamond, an $Al_2O_3$ particle, and coloidal silica may be used as an abrasive material.

A height h of the nano structure 140 is adjusted through the upper surface planarization process. The height h of the nano structure 140 is defined as a length in a vertical direction from the upper surface of the mask layer 130. The height h of the nano structure 140 may be adjusted variably in a range from an upper part of the nanocore 141 to an upper part of the second semiconductor layer 143, according to light-emitting characteristics of the nano structure 140. In FIG. 6E, an area of dotted lines in the nano structure 140 shows a range in which the height h of the nano structure 140 may be adjusted. That is, the upper surface planarization process may be performed only on upper surfaces of the passivation layer 180, the conductive layer 150, and the second semiconductor layer 143 of the nano structure 140. Upper surfaces of the active layer 142 and the nanocore 141 of the nano structure 140 may not be planarized. In some embodiments, an upper surface of the active layer 142 on the nano structure 140 may be planarized. Alternatively, there may be various modifications.

Figure 6F:
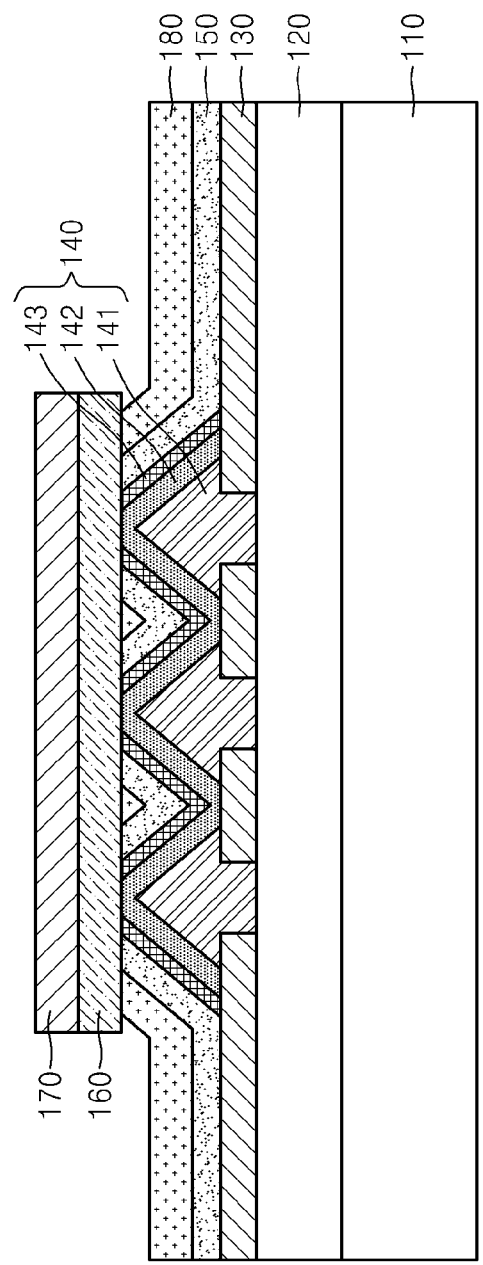

Referring to FIG. 6F, the insulating layer 160 may be formed on the passivation layer 180, the conductive layer 150, and the nano structures 140 of which upper surfaces are planarized. Additionally, the reflective layer 170 may be formed on the insulating layer 160. The insulating layer 160 and the reflective layer 170 may be deposited by using various deposition methods.

Figure 6G:
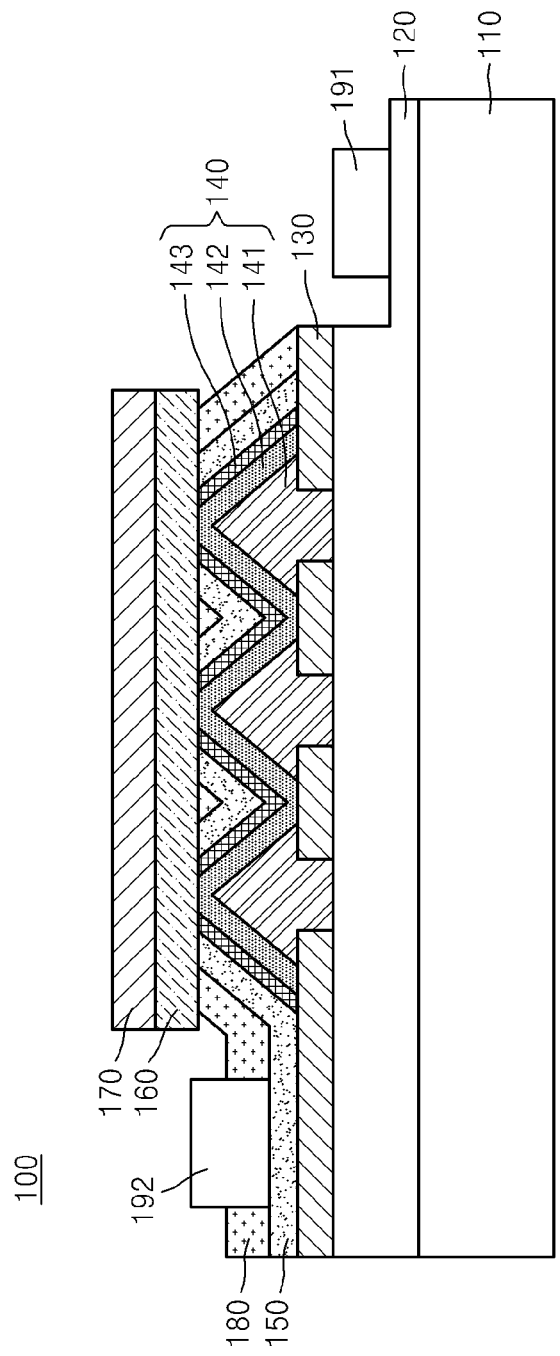

Referring to FIG. 6G, the first electrode 191 and the second electrode 192 are formed. In order to form the first electrode 191, a mesa-etching may be performed to expose a part of the first semiconductor layer 120, and the first electrode 191 may be deposited on the exposed first conductor layer 120. In order to form the second electrode 192, the passivation layer 180 may be etched to expose a part of the conductive layer 150, and the second electrode 192 may be deposited on the exposed conductive layer 150.

A sequence of a process of manufacturing the nano-structured light-emitting device 100 shown in FIG. 1 is described herein. However, there may be various modifications thereof. For example, a process of thinning the substrate 110 or a process of removing the substrate 110 may be additionally included. A process of forming a nucleation growth layer or a buffer layer between the substrate 110 and the first semiconductor layer 120 may be also added.

Figure 7:
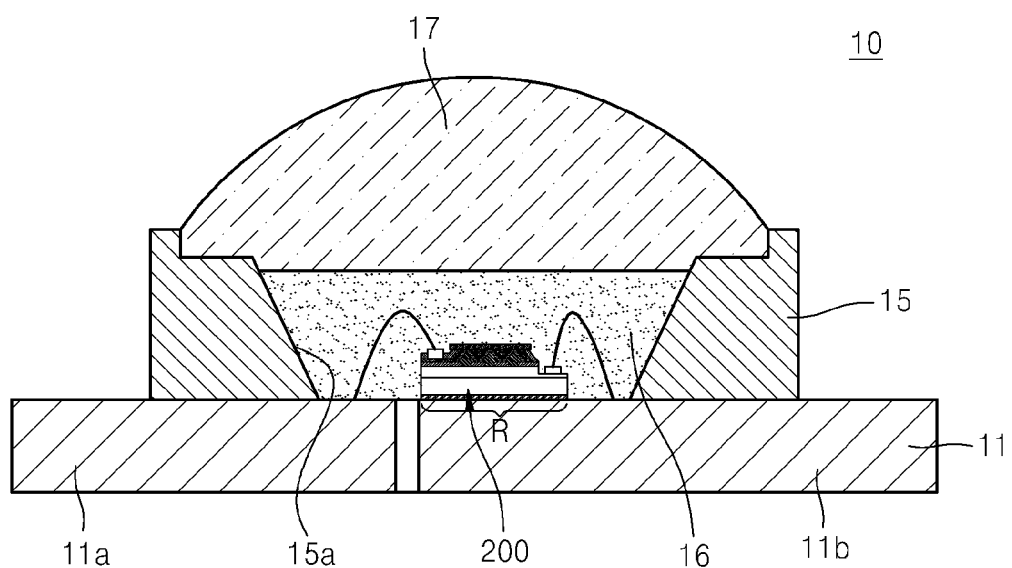
FIG. 7 is a cross-sectional side view of a structure of a light-emitting device package in which the nano-structured light-emitting device is mounted, according to an embodiment of the present disclosure.

FIG. 7 illustrates a light-emitting device package 10 in which the nano-structured light-emitting device 200 is mounted, according to an embodiment of the present disclosure.

Referring to FIG. 7, the light-emitting device package 10 includes the light-emitting device 200, a lead frame 11 that electrically connects the light-emitting device 200 to the outside, and a reflection cavity 15 that reflects and guides light emitted from the light-emitting device 200 to the outside.

The light-emitting device package 10 in which the light-emitting device 200 shown in FIG. 2 is mounted, is illustrated as an example. However, the light-emitting devices 100 through 502 or other various light-emitting devices, which may be modified accordingly, may be mounted. If one of the light-emitting devices 100 through 502 is mounted, the light-emitting device may be mounted upside-down according to a direction of light emission.

The lead frame 11 is provided to mount the light-emitting device 200 and apply a voltage to the light-emitting device 200. The lead frame 11 may be formed by performing press fabrication or etching fabrication of a metal plate such as copper or aluminum. The lead frame 11 includes a first frame area 11a and a second frame area 11b that are electrically separated from each other. The first frame area 11a and/or the second frame area 11b include a mounting part R in which the light-emitting device 200 may be mounted. A bonding pad (not shown) for easily bonding the light-emitting device 200 to the first frame area 11a and/or the second frame area 11b may be attached to the mounting part R. Additionally, the first frame area 11a and the second frame area 11b may be respectively connected to a p-electrode and an n-electrode of the light-emitting device 200. The electrode of the light-emitting device 200 and the first frame area 11a and/or the second frame area 11b may be connected to each other by using wire bonding. However, the connection thereof is not limited thereto. For example, the light-emitting device 200 may be connected to the lead frame 11 by using flip-chip bonding.

The reflection cavity 15 reflects light emitted from the light-emitting device 200 on the reflective layer 15a so that the light may be emitted in a predetermined range of degrees. The reflection cavity 15 also improves an efficiency of extraction of light emitted from the light-emitting device 200 to the outside. The reflection cavity 15 may be formed through an injection process.

An inner space of the light-emitting device 200 may be mounted with the light-emitting device 200, and then, filled with transmissible resin 16 for protecting the light-emitting device 200. The transmissible resin 16 may include a fluorescent material, thus emitting predetermined fluorescent light. For example, if the light-emitting device 200 is a blue light-emitting diode (LED) chip or an ultraviolet LED chip, the transmissible resin 16 may be formed to include powders of yellow, red, and green fluorescent materials so that white light may be emitted.

The reflection cavity 15 may further include a lens 17. The lens 17 may condense or emit light that has been emitted from the light-emitting device 200, so that light distribution may be appropriately designed. The lens 17 may be formed of transparent resin or glass. The lens 17 may be directly formed on the reflection cavity 15 or additionally formed and attached to the reflection cavity 15. The transmissible resin 16 and the lens 17 may be formed as one body.

Figure 8:
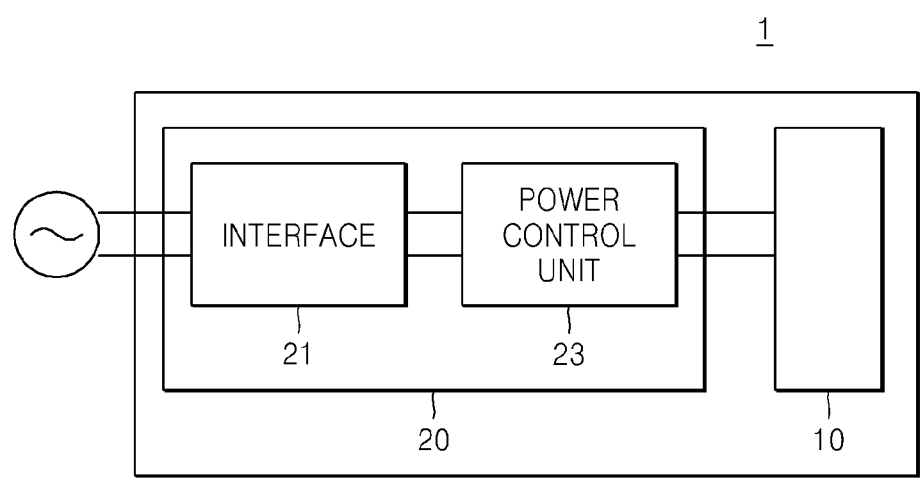
FIG. 8 is a configuration map of a light-emitting device system that employs the nano-structured light-emitting device, according to an embodiment of the present disclosure.

FIG. 8 is a configuration map of a light-emitting device system 1 that employs the nano-structured light-emitting device, according to an embodiment of the present disclosure. Referring to FIG. 8, the light-emitting system 1 includes the light-emitting device package 10 and a power-supply unit 20 for supplying power to the light-emitting device package 10.

In the light-emitting device package 10, the light-emitting devices 100 through 400 and 501 through 502, shown in the embodiments described above, may be used.

The power-supply unit 20 may include an interface 21 for receiving power and a power-control unit 23 for controlling power supplied to the light-emitting device package 10. The interface 21 may include a fuse for interrupting over-current and an electromagnetic wave interference (EMI) filter for filtering an EMI signal. The power may be supplied from the outside or from a built-in battery. If alternating current (AC) power is supplied, the power control unit 23 may further include a rectifying unit for converting AC into direct current (DC) and a constant voltage control unit for converting a voltage into a voltage appropriate for the light-emitting device package 10. If the power supply is a DC source that has a voltage appropriate for the light-emitting device package 10, for example, a battery, the rectifying unit or the constant voltage control unit may be omitted. Additionally, if a device such as an AC-LED is employed as a light-emitting device of the light-emitting device package 10, an AC source may be supplied directly to the light-emitting device package 10. In this case, the rectifying unit or the constant voltage control unit may also be omitted.

The light-emitting device system 1 is a lighting system, and may be used for an LED-tube, Flat panel light, or a lamp. The light-emitting device system 1 may also be used for a liquid-crystal display system, a television backlight unit system for a television (TV), a car or the like.

The various nano-structured light-emitting devices 100 through 502, which employ the nano structure 140 having a hexagonal prismoid with a flat upper surface, have been described. The specific shapes of the nano-structured light-emitting devices 100 through 502, illustrated herein, are only examples, and a specific shape of the nano structure 140 may vary with a desired amount of light.

Additionally, the various structures of the nano-structured light-emitting devices 100 through 502, which include the light-emitting nano structure 140, have been described. However, the descriptions thereof, provided herein, are only examples. For example, a specific shape of an electrode structure may be variably modified. Additionally, as an example, the first type is described as an n-type, and the second type is described as a p-type. However, it may be vice versa.

While the present disclosure has been particularly shown and described with reference to exemplary embodiments thereof, it will be understood that various changes in form and details may be made therein without departing from the spirit and scope of the following claims.

What is claimed is:

1. A nano-structured light-emitting device comprising:
a first semiconductor layer;
at least one nano structure disposed on the first semiconductor layer and each of said at least one nano structure comprising a nanocore, and an active layer and a second semiconductor layer disposed on a surface of the nanocore, the active layer and the second semiconductor layer of the nano structure sharing a common planar upper surface that cuts through a thickness of the second semiconductor layer and is non-orthogonal to an interface between the active layer and the second semiconductor layer;
a conductive layer surrounding sides of the at least one nano structure;
a first electrode electrically connected to the first semiconductor layer; and
a second electrode electrically connected to the conductive layer.

2. The nano-structured light-emitting device of claim 1, wherein the nano structure has a shape of a rod.

3. The nano-structured light-emitting device of claim 1, wherein at least one from among the nanocore, the active layer, and the second semiconductor layer comprises a hexagonal prismoid having a flat upper surface.

4. The nano-structured light-emitting device of claim 1, wherein the active layer has a flat upper surface, and an extended surface of the flat upper surface of the active layer and an extended surface of an upper surface of the second semiconductor layer form a same surface.

5. The nano-structured light-emitting device of claim 1, wherein the nano structure comprises a shape of a hexagonal prismoid, and further comprises a shape of a rod at a lower part of the shape of the hexagonal prismoid.

6. The nano-structured light-emitting device of claim 1,
wherein the at least one nano structure comprises a plurality of nano structures,
wherein the conductive layer surrounds sides of the plurality of nano structures, and
wherein the nano-structured light-emitting device further comprises an insulating layer disposed on the plurality of nano structures and the conductive layer, and the insulating layer allowing light transmission.

7. The nano-structured light-emitting device of claim 6, wherein the insulating layer comprises a distributed bragg reflector (DBR).

8. The nano-structured light-emitting device of claim 6, further comprising a reflective layer disposed on the insulating layer.

9. The nano-structured light-emitting device of claim 1, further comprising a passivation layer disposed on a partial area on the conductive layer.

10. The nano-structured light-emitting device of claim 1, further comprising a mask layer disposed on an upper surface of the first semiconductor layer, the mask layer comprising a through-hole,
wherein the nanocore protrudes from the through-hole.

11. A nano-structured light-emitting device comprising:
a first semiconductor layer;
at least one multilayer light-emitting nano structure disposed on the first semiconductor layer and comprising sides that are inclined with respect to the first semiconductor layer, the at least one light-emitting nano structure having a flat upper surface through which multiple layers of the multilayer nano structure are exposed
wherein the flat upper surface is substantially parallel with the first semiconductor layer and is non-orthogonally inclined with respect to the sides of the nano structure; and
a conductive layer covering the sides of the at least one nano structure.

12. The nano-structured light-emitting device of claim 11, wherein the at least one nano structure comprises:
a GaN-based nanocore having a surface that is one of a non-polar surface and a quasi-polar surface;
an active layer disposed on the surface of the GaN-based nanocore; and
a GaN-based second semiconductor layer disposed on a surface of the active layer and having a flat upper surface.

13. The nano-structured light-emitting device of claim 12, wherein the GaN-based nanocore comprises $Al_xIn_yGa_{1-x-y}N$ containing a p-type impurity, where $0 \leq x \leq 1$, $0 \leq y < 1$ and $x+y<1$.

14. The nano-structured light-emitting device of claim 12, wherein the active layer comprises a quantum-well structure having stacked layers, in which $In_aGa_{1-a}N/Al_xIn_yGa_{1-x-y}N$, where $0 \leq a \leq 1$, $0 \leq x \leq 1$, $0 \leq y \leq 1$ and $x+y<1$.

15. The nano-structured light-emitting device of claim 12, wherein the GaN-based second semiconductor layer comprises $Al_xIn_yGa_{1-x-y}N$ containing an n-type impurity, where $0 \leq x \leq 1$, $0 \leq y \leq 1$ and $x+y<1$.

16. The nano-structured light-emitting device of claim 10, wherein the nanocore protrudes vertically from the through-hole and extends laterally onto a surface of the mask layer surrounding the through-hole.

17. The nano-structure light-emitting device of claim 10, wherein the active layer is disposed directly on the nanocore that protrudes from the through-hole.

18. The nano-structure light-emitting device of claim 10, wherein:
   the through-hole comprises a plurality of through-holes,
   the at least one nano structure comprises a plurality of nano structures each disposed on the first semiconductor layer to protrude through a respective through-hole of the mask layer and comprising a nanocore, and an active layer and a second semiconductor layer disposed on a surface of the nanocore, and
   the plurality of nano structures extend over the mask layer to cover portions of the mask layer disposed between adjacent through-holes.

* * * * *